United States Patent
Ueki et al.

(10) Patent No.: US 10,928,857 B2
(45) Date of Patent: Feb. 23, 2021

(54) ELECTRONIC DEVICE

(71) Applicant: Panasonic Intellectual Property Management Co., Ltd., Osaka (JP)

(72) Inventors: Yusuke Ueki, Kyoto (JP); Ryo Yonezawa, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/547,745

(22) Filed: Aug. 22, 2019

(65) Prior Publication Data

US 2019/0377382 A1    Dec. 12, 2019

Related U.S. Application Data

(63) Continuation of application No. PCT/JP2018/005677, filed on Feb. 19, 2018.

(30) Foreign Application Priority Data

Feb. 24, 2017   (JP) .............................. JP2017-033315

(51) Int. Cl.
*G06F 1/16* (2006.01)
*H01M 2/10* (2006.01)

(52) U.S. Cl.
CPC .......... *G06F 1/1635* (2013.01); *G06F 1/1637* (2013.01); *G06F 1/1677* (2013.01); *H01M 2/1022* (2013.01)

(58) Field of Classification Search
None
See application file for complete search history.

(56) References Cited

U.S. PATENT DOCUMENTS 5,177,672 A * 1/1993 Ito .......................... G06F 1/1616
361/741
5,808,861 A * 9/1998 Nakajima ............... G06F 1/184
361/679.27

(Continued)

FOREIGN PATENT DOCUMENTS

JP    2000-075962 A    3/2000
JP    2008-269248 A    11/2008

(Continued)

OTHER PUBLICATIONS

International Search Report for corresponding Application No. PCT/JP2018/005677, dated Apr. 10, 2018.

*Primary Examiner* — James Wu
*Assistant Examiner* — Christopher L Augustin
(74) *Attorney, Agent, or Firm* — Renner, Otto, Boisselle & Sklar, LLP

(57) ABSTRACT

A tablet computer (an example of an electronic device) includes a housing that contains an electric component, the housing including a fixed cover and a movable cover that constitute adjacent regions of a back surface of the housing, a hinge shaft that is disposed between a front edge of the fixed cover and a back edge of the movable cover that are adjacent to each other and supports the movable cover, and a first attachment plate that supports the movable cover rotatably about the back edge. The first attachment plate is movably attached to an inner chassis to which the fixed cover is fixed such that the hinge shaft is movable away from the front edge of the fixed cover.

4 Claims, 10 Drawing Sheets

(56) References Cited

U.S. PATENT DOCUMENTS

| | | | | |
|---|---|---|---|---|
| 6,409,042 | B1* | 6/2002 | Hirano | H01M 2/1022 |
| | | | | 220/812 |
| 7,488,555 | B2* | 2/2009 | Chen | H01M 2/1066 |
| | | | | 429/100 |
| 7,867,646 | B2* | 1/2011 | Rhodes | F24F 11/30 |
| | | | | 429/100 |
| 8,567,637 | B2* | 10/2013 | Mori | B41J 3/46 |
| | | | | 220/827 |
| 8,861,772 | B2* | 10/2014 | Huang | H04R 1/10 |
| | | | | 361/679.01 |
| 9,101,086 | B2* | 8/2015 | Huang | H05K 5/0239 |
| 9,841,789 | B2* | 12/2017 | Lin | G06F 1/1615 |
| 2007/0293005 | A1* | 12/2007 | Shigenobu | G06F 1/1616 |
| | | | | 438/238 |
| 2010/0040946 | A1* | 2/2010 | Tsuji | H01M 2/1022 |
| | | | | 429/175 |
| 2014/0117826 | A1* | 5/2014 | Senatori | G06F 1/1633 |
| | | | | 312/294 |
| 2017/0283138 | A1 | 10/2017 | Mori | |
| 2017/0292302 | A1* | 10/2017 | Tomky | E05D 11/084 |

FOREIGN PATENT DOCUMENTS

| | | |
|---|---|---|
| JP | 2010-020112 A | 1/2010 |
| JP | 2012-126415 A | 7/2012 |
| WO | 2016/103615 A1 | 6/2016 |

\* cited by examiner

ELECTRONIC DEVICE

TECHNICAL FIELD

The present disclosure relates to an electronic device having a cover that constitutes a part of one surface of a housing in which an electronic component is contained.

BACKGROUND ART

PTL 1 discloses an electronic device in which a part of one surface of a housing of the electronic device is constituted by a detachable lid and a battery is detachably contained on an inner side of the lid.

CITATION LIST

Patent Literature

PTL 1: International Publication No. 2016/103615

SUMMARY

In a case where a lid (cover) is detachable, there is a risk of loss of the detached lid. One measure against this risk is to make the lid openable and closable with use of a hinge. However, this configuration has a risk of impairing ease of attachment and detachment of a battery due to presence of the lid.

An object of the present disclosure is to improve convenience of an electronic device in which a cover that constitutes a part of one surface of a housing is movable rotationally about a hinge shaft.

An electronic device according to an aspect of the present disclosure includes: a housing that contains an electronic component, the housing including a fixed cover and a movable cover that constitute adjacent regions of one surface of the housing; a hinge shaft that is disposed between a first edge of the fixed cover and a second edge of the movable cover that are adjacent to each other, and supports the movable cover; and a support plate that is connected to the movable cover through the hinge shaft, and supports the movable cover rotatably about the second edge.

The fixed cover is fixed to an inner chassis. The support plate is movably attached to the inner chassis to enable the hinge shaft to move away from the first edge of the fixed cover.

This technique of the present disclosure allows the movable cover to move away from the fixed cover in a case where the movable cover is opened. Accordingly, interference between the second edge of the movable cover that is being opened and the first edge of the fixed cover is hard to occur. This can make the opening angle of the movable cover large. It is therefore easier for a user to perform an internal operation or the like in the electronic device, thereby improving convenience.

DESCRIPTION OF EMBODIMENTS

Exemplary embodiments are described in detail below with reference to the drawings as appropriate. However, description that is more detailed than necessary may be omitted. For example, a detailed description of a well-known matter and a repeated description of substantially the same configuration will be omitted in some cases. This is to avoid unnecessary redundancy in the following description and to facilitate understanding by those skilled in the art.

Here, the inventor of the present disclosure provides the accompanying drawings and the following description such that those skilled in the art can sufficiently understand the present disclosure, and therefore, does not intend to restrict the subject matters of claims by the accompanying drawings and the following description.

First Exemplary Embodiment

A first exemplary embodiment will be described below with reference to the drawings.
[1. Configuration]
[1-1. Outline]

Figure 1:
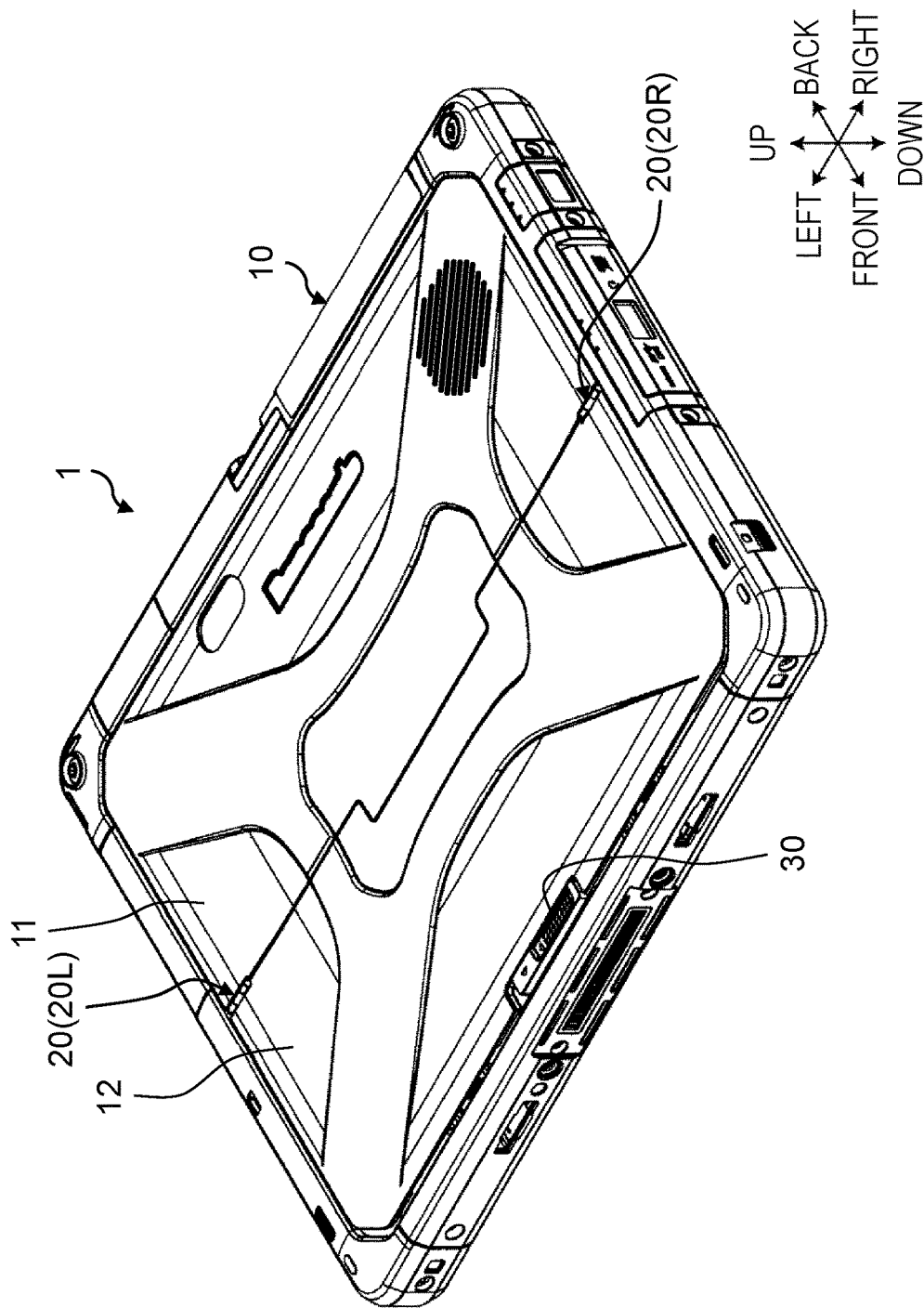
FIG. 1 is a perspective view of a back surface side of a tablet computer according to a first exemplary embodiment.
Figure 2:
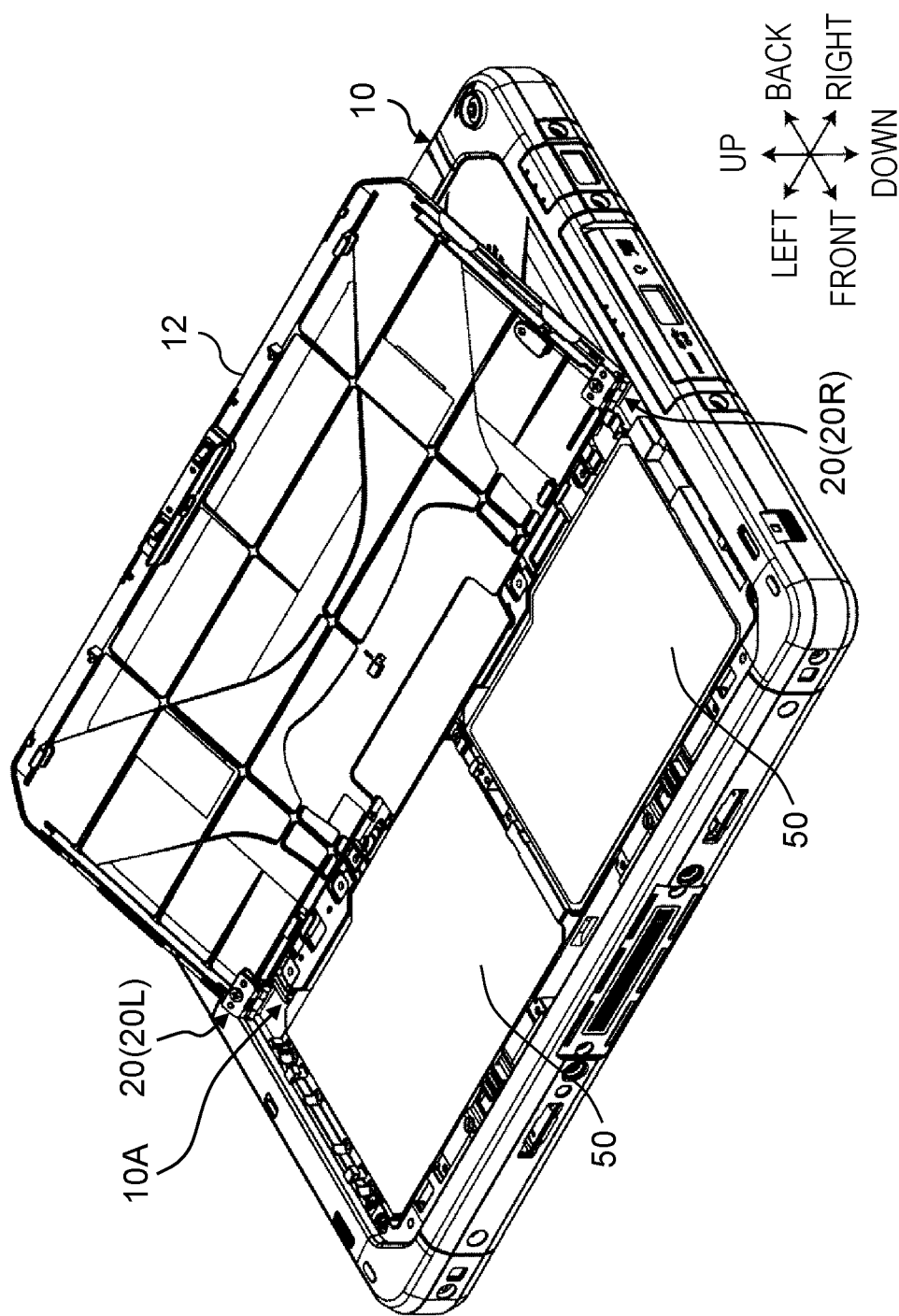
FIG. 2 is a perspective view of the back surface side of the tablet computer and illustrates a state where a movable cover is opened.

FIGS. 1 and 2 are perspective views of a back surface side of tablet computer 1 according to the first exemplary embodiment. FIG. 1 illustrates a state where movable cover 12 is closed, and FIG. 2 illustrates a state where cover 12 is opened. Tablet computer 1 is an example of an electronic device. In the drawings, directions are given as appropriate for convenience for the purpose of explanation and easier understanding. The directions are given assuming that tablet computer 1 is viewed in a state where one main surface (back surface) side on which movable cover 12 is provided faces upward as in FIG. 1. However, this does not mean that tablet computer 1 should be used and placed based on these directions. In the example of these drawings, a left-right direction corresponds to a device width direction, a front-back direction corresponds to a device depth direction, and an up-down direction corresponds to a device thickness direction.

A display (not illustrated) having a touch panel is provided on the other main surface (a main surface on a lower side in FIG. 1; generally recognized as a front surface) of tablet computer 1. Various electronic components such as a central processing unit (CPU), a memory, a solid state drive (SSD), an image processor, and a communication module are contained in housing 10 of tablet computer 1. Furthermore, battery 50 that supplies electric power to the display and various electronic components is detachably contained in tablet computer 1. The CPU reads out a program and data stored in the solid state drive, executes arithmetic processing by using the memory, and thus realizes various functions of tablet computer 1.

Furthermore, fixed cover 11 and movable cover 12 that constitute a back design surface of housing 10 are provided on the back surface (one surface) of tablet computer 1. Fixed cover 11 is fixed to inner chassis 10A with use of a screw. Movable cover 12 is rotatably attached to inner chassis 10A through hinges 20L and 20R at left and right ends of a back end side of movable cover 12. A lock mechanism that locks a front end side of movable cover 12 onto inner chassis 10A is provided on the front end side of movable cover 12 and inner chassis 10A. The lock mechanism can be unlocked by sliding operation lever 30 in a predetermined direction.

[1-2. Structure of Hinge Part]

Figure 3:
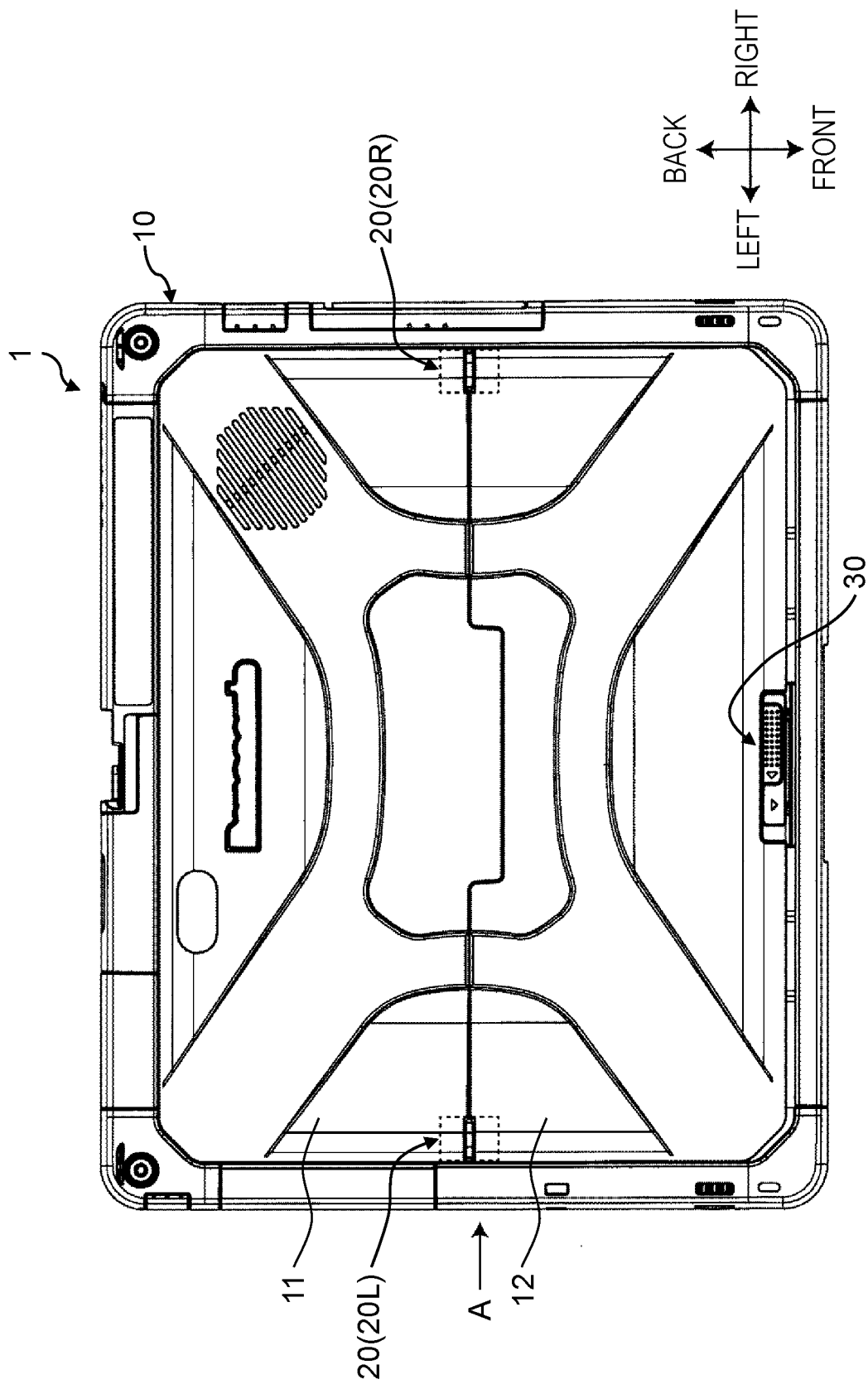
FIG. 3 is a back view of the tablet computer.
Figure 4:
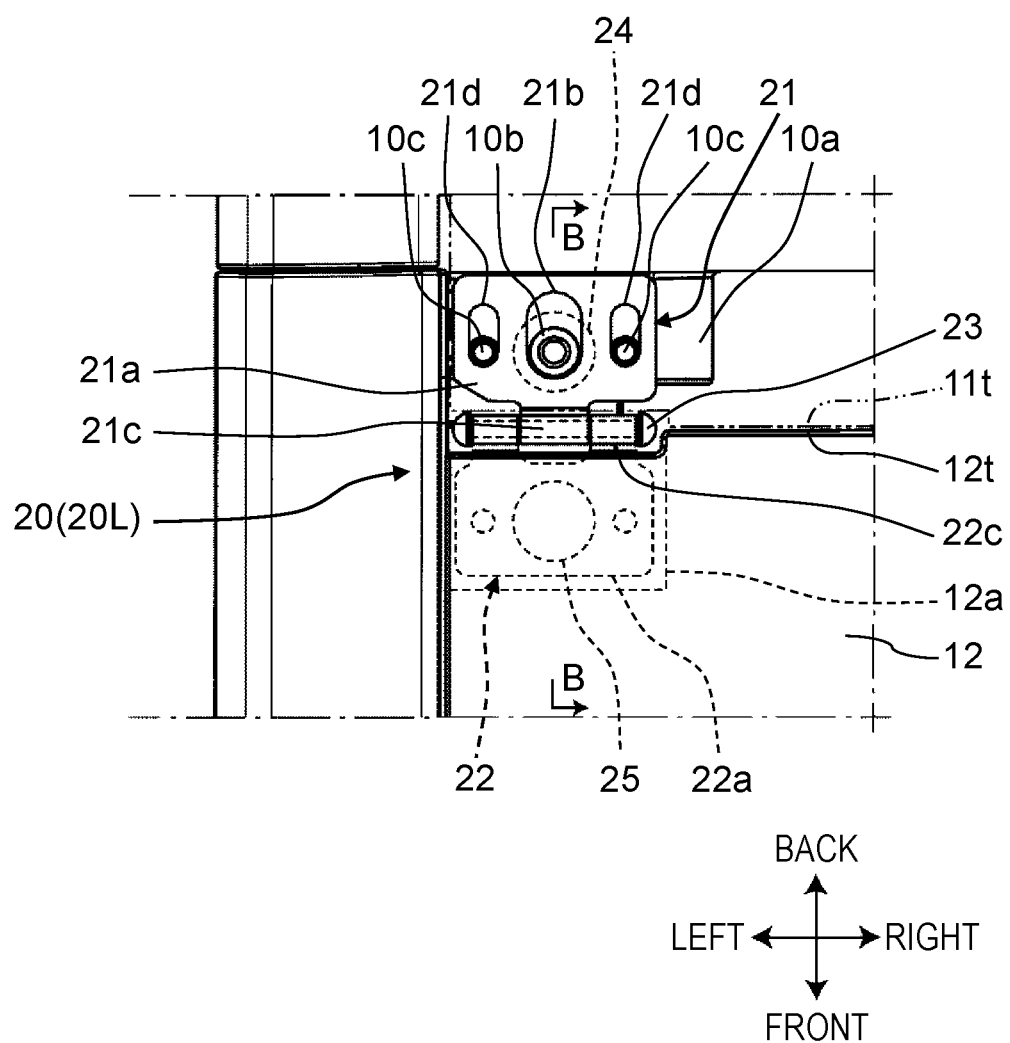
FIG. 4 is an enlarged view of a left hinge part indicated by arrow A of FIG. 3.
Figure 5:
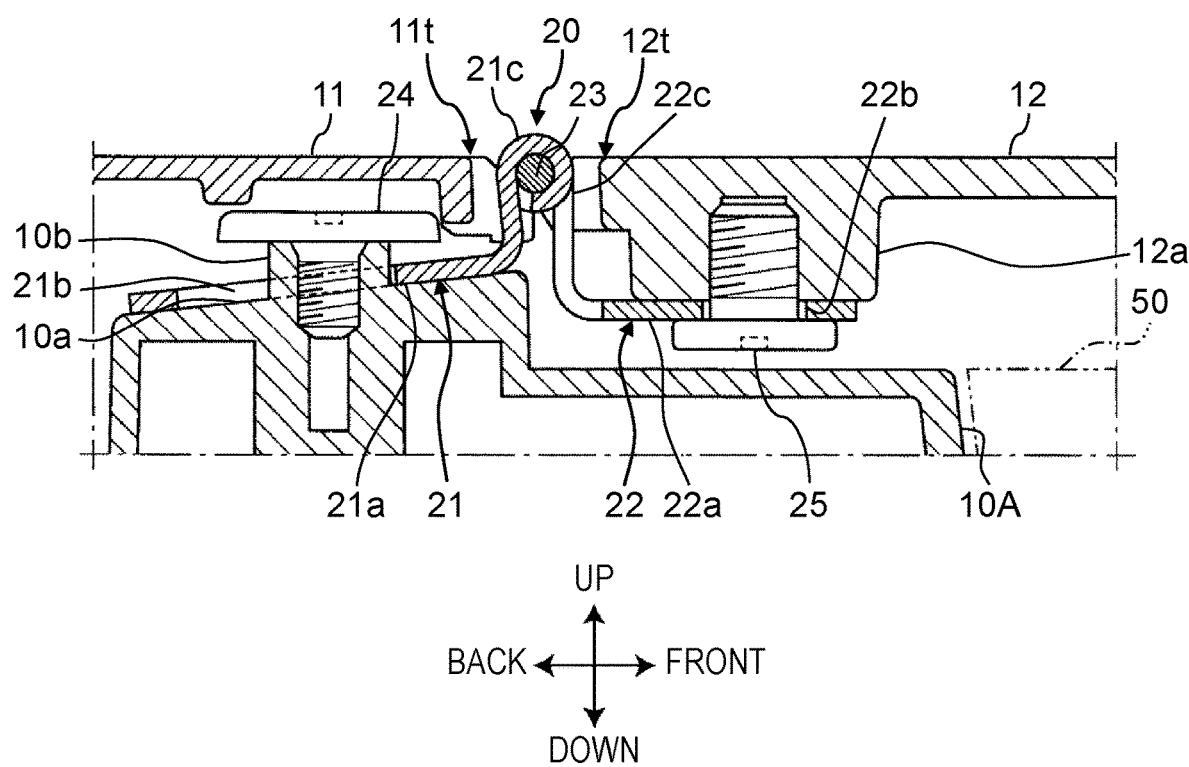
FIG. 5 is a cross-sectional view taken along line B-B of FIG. 4.

A structure of a hinge 20L, 20R part in tablet computer 1 is described in detail. FIG. 3 is a back view of tablet computer 1. FIG. 4 is an enlarged view of the left hinge 20L part indicated by arrow A of FIG. 3. FIG. 5 is a cross-sectional view taken along line B-B of FIG. 4. Configurations of the left and right hinges 20L and 20R parts are symmetrical. Therefore, left hinge 20L is described as a representative. Hereinafter, hinges 20L, 20R are sometimes collectively referred to as "hinges 20".

Hinge 20 has first attachment plate 21, second attachment plate 22, and hinge shaft 23. Hinge shaft 23 is disposed between front edge 11t of fixed cover 11 and back edge 12t of movable cover 12.

Second attachment plate 22 has body 22a and shaft bearing 22c that is provided at a back end of body 22a and rotatably supports hinge shaft 23. Body 22a is provided with screw insertion hole 22b. Screw 25 is inserted into screw insertion hole 22b and is screwed into screw fixing part 12a of movable cover 12.

First attachment plate 21 has body 21a and shaft bearing 21c that is provided at a front end of body 21a and rotatably supports hinge shaft 23. Body 21a is provided with screw boss insertion hole 21b. Screw boss 10b of inner chassis 10A is inserted into screw boss insertion hole 21b. Screw 24 is screwed into screw boss 10b.

Screw boss insertion hole 21b extends in a direction that crosses (e.g., in a direction perpendicular to) hinge shaft 23.

Inner chassis 10A has attachment surface 10a on which first attachment plate 21 is attached. Attachment surface 10a faces fixed cover 11 and is inclined towards hinge shaft 23, approaching fixed cover 11. Accordingly, attachment surface 10a is spaced farther away from fixed cover 11 as a distance from back edge 12t becomes larger in a direction that crosses back edge 12t of movable cover 12.

Guide protrusions 10c are provided on left and right of screw boss 10b on attachment surface 10a. Furthermore, guide holes 21d in which guide protrusions 10c fit are provided on left and right of screw boss insertion hole 21b in body 21a of first attachment plate 21. Guide hole 21d is a long hole that extends parallel with screw boss insertion hole 21b.

Figure 6:
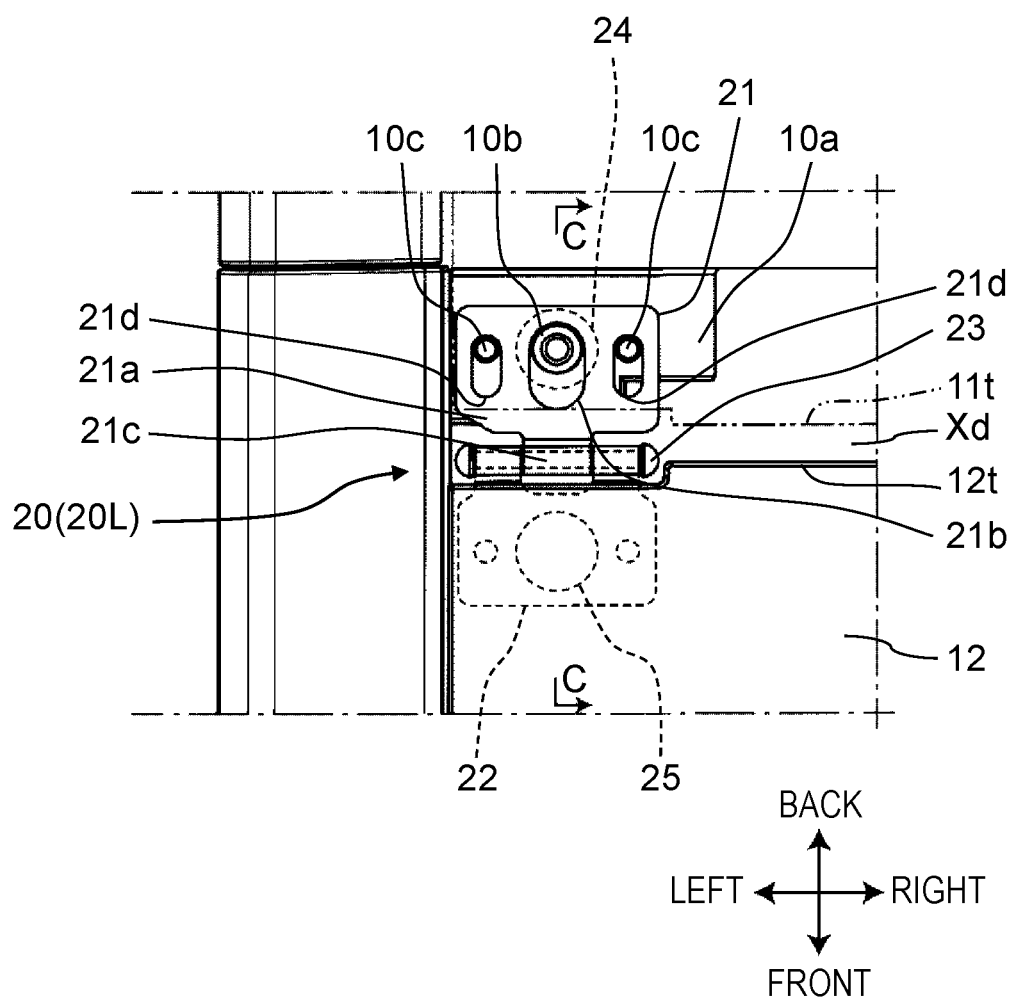
FIG. 6 is an enlarged view of the hinge part and illustrates a state where the hinge has been slid to a front side.
Figure 7:
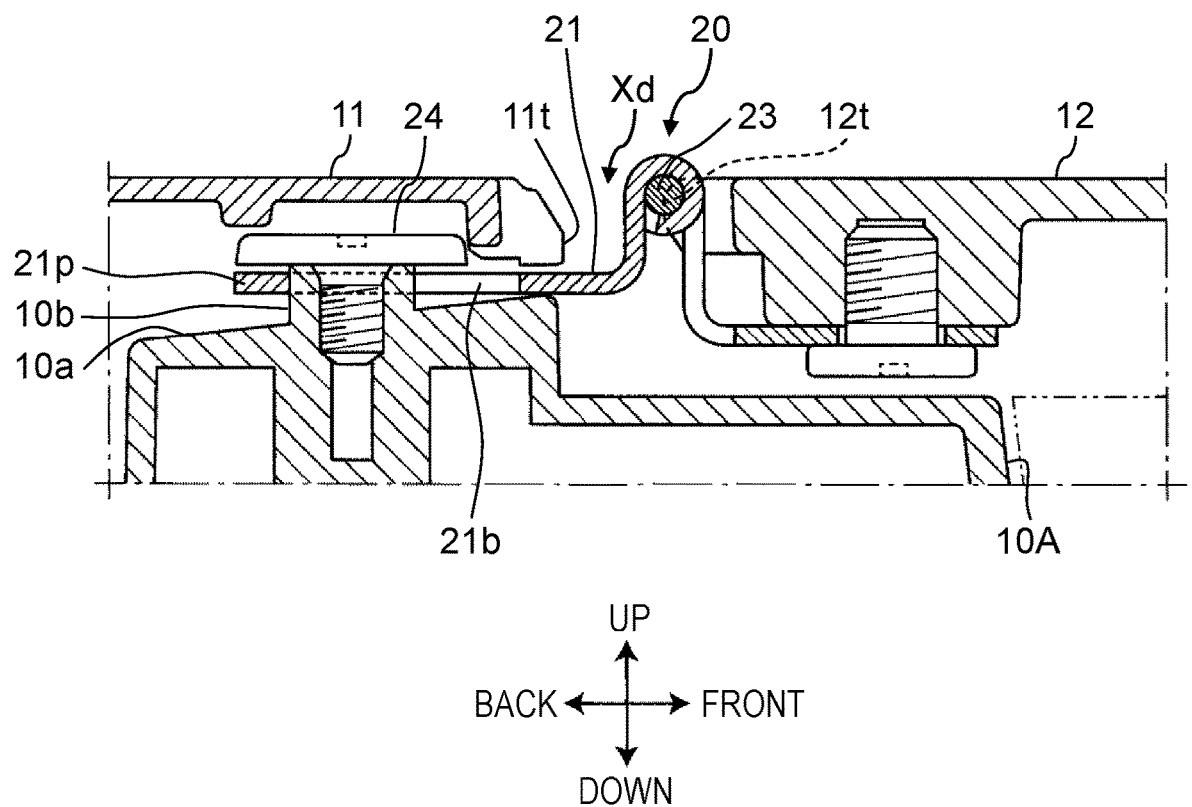
FIG. 7 is a cross-sectional view taken along line C-C of FIG. 6.

FIG. 6 is an enlarged view of the hinge 20 part and illustrates a state where hinge 20 has been slid to a front side. FIG. 7 is a cross-sectional view taken along line C-C of FIG. 6.

Since screw boss insertion hole 21b of first attachment plate 21 is a long hole, first attachment plate 21 is movable in a longitudinal direction of screw boss insertion hole 21b (the front-back direction in FIGS. 6 and 7; a direction that crosses hinge shaft 23), as illustrated in FIGS. 6 and 7. This allows movable cover 12 to move toward the front side in a case where movable cover 12 is opened. In order to move movable cover 12 toward the front side, locking between movable cover 12 and inner chassis 10A is unlocked by operating operation lever 30 of FIG. 1.

Figure 8:
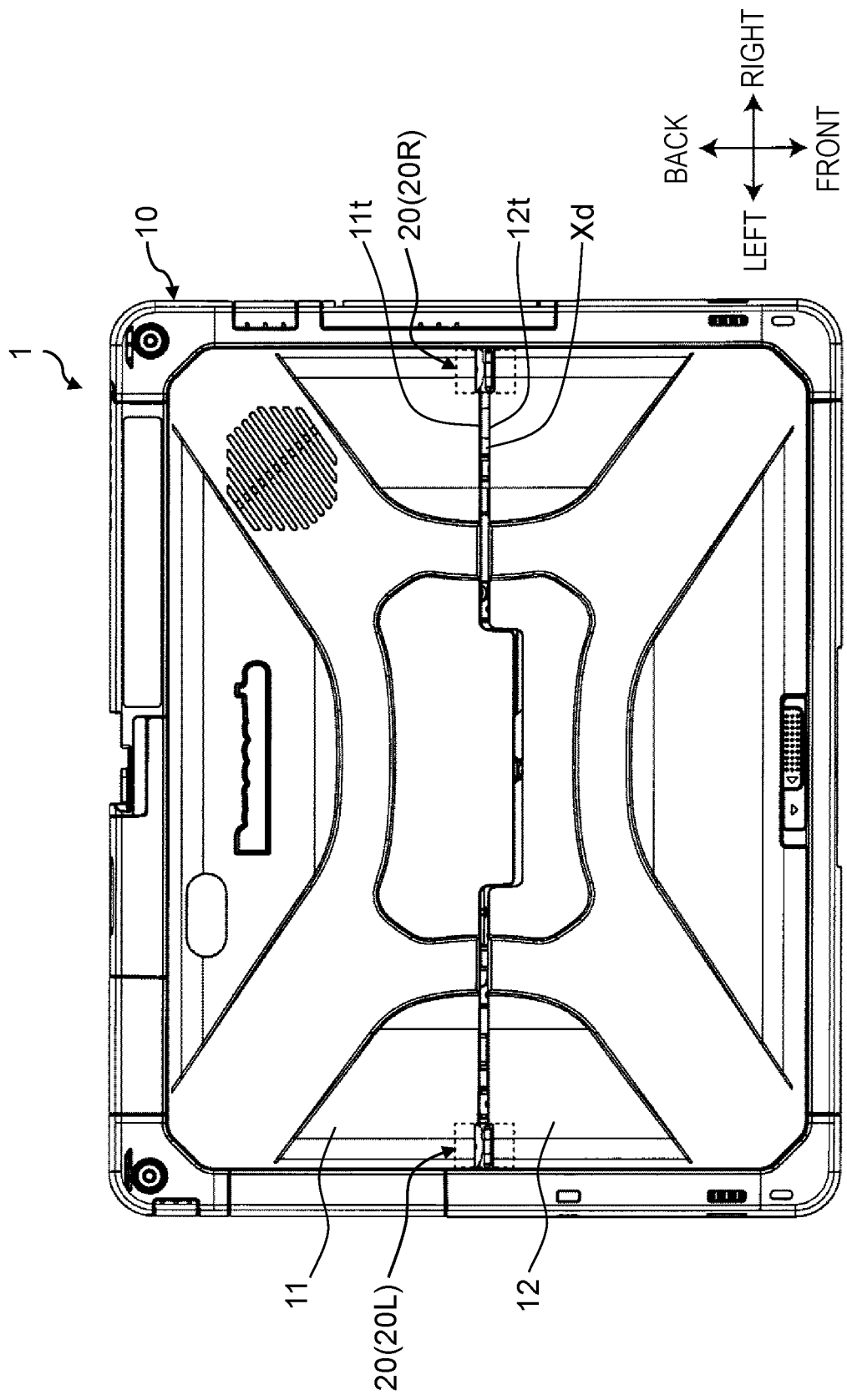
FIG. 8 is a back view of the tablet computer and illustrates a state where the hinge has been slid to the front side.

FIG. 8 is a back view of tablet computer 1 and illustrates a state where hinge 20 has been slid to the front side. Moving movable cover 12 toward the front side expands gap Xd between front edge 11t of fixed cover 11 and back edge 12t of movable cover 12.

Figure 9:
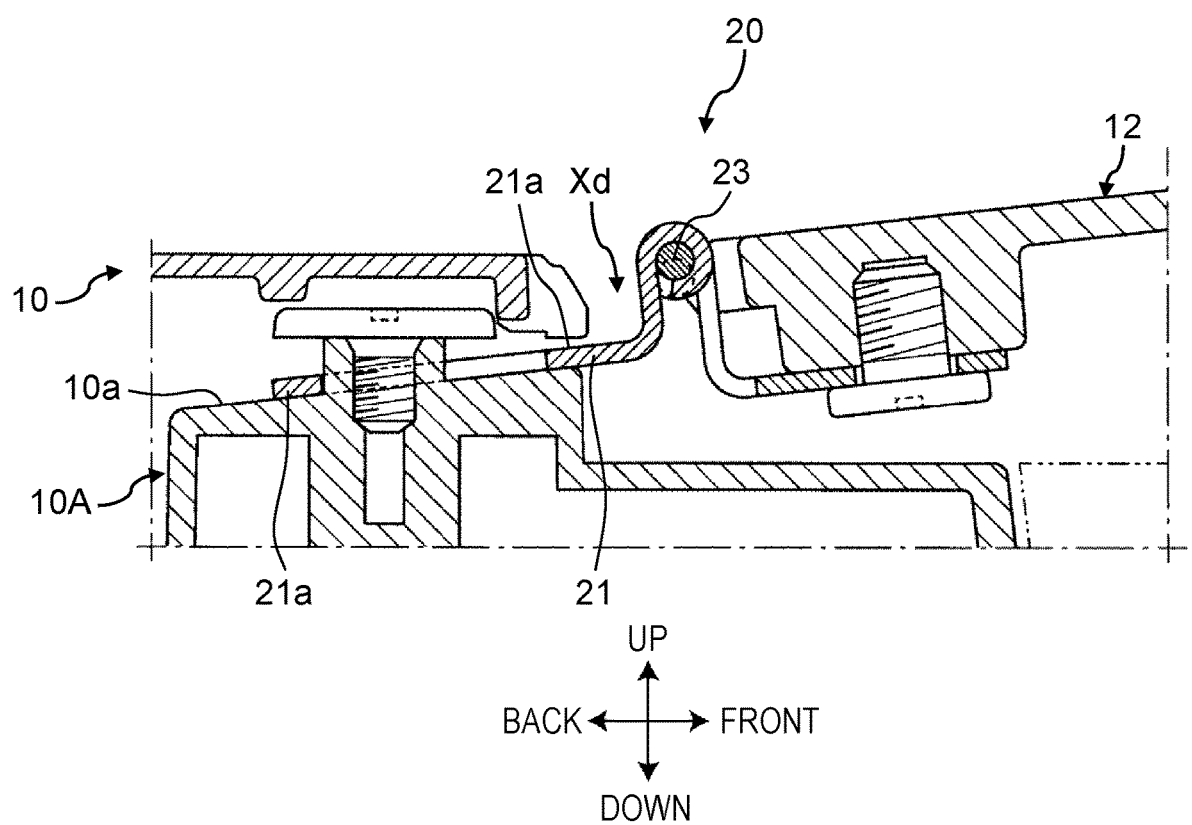
FIG. 9 is a cross-sectional view taken along the same line as FIG. 6 and illustrates a state where the movable cover is being opened.
Figure 10:
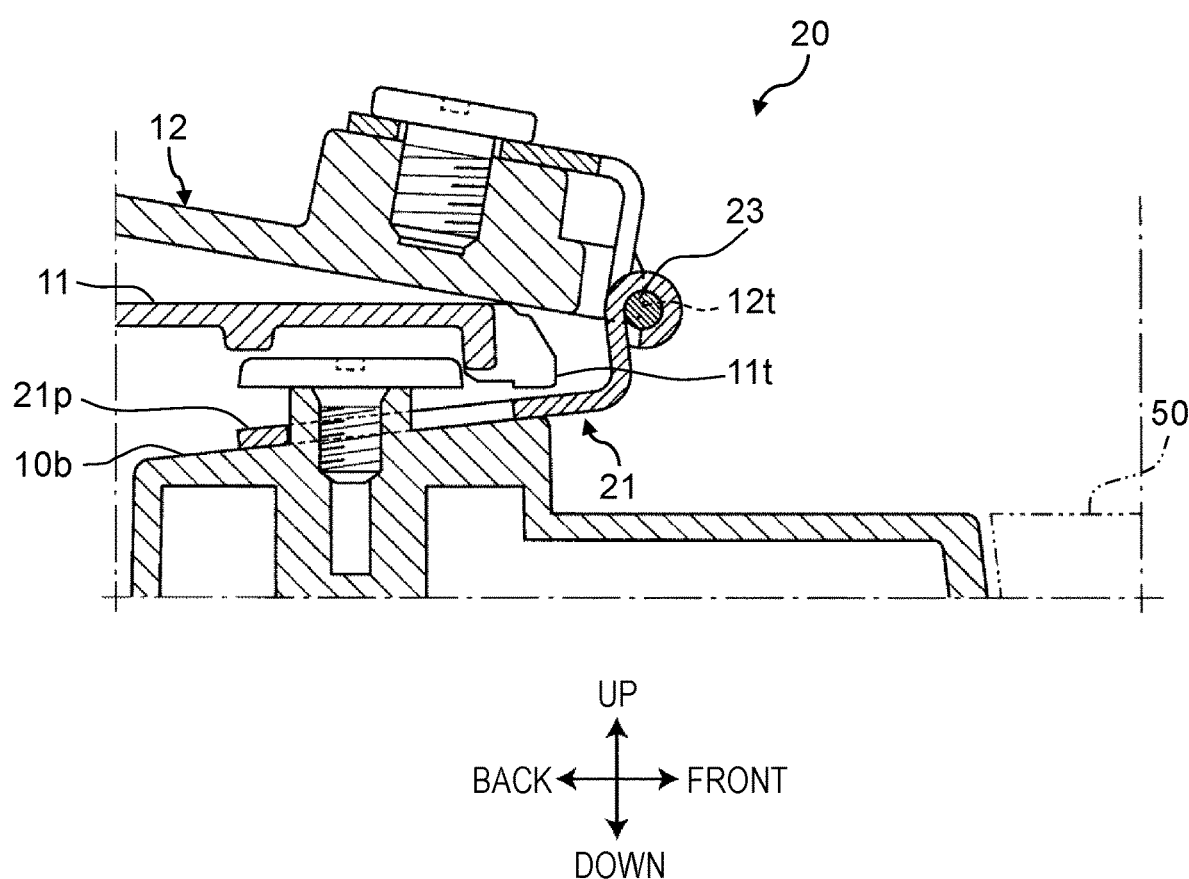
FIG. 10 is a cross-sectional view taken along the same line as FIG. 6 and illustrates a state where movable cover 12 has been opened.

FIG. 9 is a cross-sectional view taken along the same line as FIG. 6 and illustrates a state where movable cover 12 is being opened. FIG. 10 is a cross-sectional view taken along the same line as FIG. 6 and illustrates a state where movable cover 12 has been opened. In order to open movable cover 12, the front end side of movable cover 12 is lifted up as illustrated in FIG. 9. This causes body 21a of first attachment plate 21 of hinge 20 to be inclined along inclined attachment surface 10a of inner chassis 10A. As a result, hinge shaft 23 moves from a position indicated by the broken line to a position indicated by the solid line toward an outside of housing 10 in the up-down direction (the device thickness direction). Then, by further rotating movable cover 12, movable cover 12 can be opened to a reversed state as illustrated in FIG. 10. That is, an opening angle of movable cover 12 can be made as large as possible. This makes it easy to attach and detach battery 50. Furthermore, it is possible to keep back edge 12t of movable cover 12 from making contact with or scraping against front edge 11t of fixed cover 11. It is therefore possible to prevent fixed cover 11 and movable cover 12 from being damaged.

[2. Effects and Other Benefits]

Tablet computer 1 (an example of an electronic device) according to the present exemplary embodiment includes housing 10 that contains an electronic component, housing 10 including fixed cover 11 and movable cover 12 that constitute adjacent regions of a back surface (one surface) of housing 10, hinge shaft 23 that is disposed between front edge 11t (a first edge) of fixed cover 11 and back edge 12t (a second edge) of movable cover 12 that are adjacent to each other and supports movable cover 12, and first attachment plate 21 (a support plate) that is connected to movable cover 12 through hinge shaft 23 and rotatably supports movable cover 12 about back edge 12t (the second edge).

Fixed cover 11 is fixed to inner chassis 10A. First attachment plate 21 (the support plate) is movably attached to inner chassis 10A such that hinge shaft 23 is movable away from front edge 11t (the first edge) of fixed cover 11.

This allows movable cover 12 to move away from fixed cover 11 in a case where movable cover 12 is opened. Accordingly, interference between back edge 12t (the second edge) of movable cover 12 that is being opened and front edge 11t (the first edge) of fixed cover 11 is hard to occur. This can make the opening angle of movable cover 12 large. It is therefore easier for a user to perform an internal operation or the like in tablet computer 1, thereby improving convenience.

In the present exemplary embodiment, inner chassis 10A has attachment surface 10a on which first attachment plate 21 (the support plate) is attached. Attachment surface 10a faces fixed cover 11 and is inclined towards hinge shaft 23, approaching fixed cover 11. Attachment surface 10a is configured such that hinge shaft 23 is movable toward an outside of the housing in a case where hinge shaft 23 is moved away from front edge 11t (the first edge) of fixed cover 11.

This causes hinge shaft 23 to also move toward an outside in a direction perpendicular to fixed cover 11 in a case where movable cover 12 (hinge shaft 23) is moved away from fixed cover 11. Accordingly, interference between back edge 12t (the second edge) of movable cover 12 that is being opened and front edge 11t (the first edge) of fixed cover 11 is harder to occur. This can make the opening angle of movable cover 12 larger. As a result, user's convenience is further improved.

In the present exemplary embodiment, first attachment plate 21 (the support plate) is attached to attachment surface 10a with use of screw 24.

First attachment plate 21 (the support plate) has screw boss insertion hole 21b (an insertion hole) into which screw 24 is inserted. Screw boss insertion hole 21b extends in a direction that crosses hinge shaft 23.

This allows movable cover 12 (hinge shaft 23) to move away from fixed cover 11 with a simple configuration.

In the present exemplary embodiment, inner chassis 10A detachably contains battery 50.

Movable cover 12 is a cover that is opened and closed when battery 50 is attached or detached.

With the configuration, ease of attachment and detachment of battery 50 can be improved. In order to attach or detach battery 50, it is preferable to open movable cover 12 at an angle as large as possible. This can be achieved in the present exemplary embodiment.

Other Exemplary Embodiments

The first exemplary embodiment has been described above as an example of the technique disclosed in the present disclosure. However, the technique of the present disclosure is not limited to the first exemplary embodiment, and also applicable to other exemplary embodiments that undergo some modifications, replacements, additions, and omissions, for example, as appropriate. A new exemplary embodiment can be obtained by combining the constituent elements described in the first exemplary embodiment. Some other exemplary embodiments will be described below as examples.

(1) In the above exemplary embodiment, a case where the electronic device according to the present disclosure is applied to tablet computer 1 has been described. However, the electronic device according to the present disclosure is widely applicable not only to a tablet computer, but also to a smartphone, a notebook computer, a desktop computer, and other kinds of electronic devices.

(2) In the above exemplary embodiment, a case where the movable cover is movable cover 12 that is opened and closed in a case where battery 50 is attached or detached has been exemplified. However, in the present disclosure, the movable cover need not be a cover that is opened and closed in a case where battery 50 is attached or detached. The movable cover according to the present disclosure only needs to be a cover that is opened and closed in a case where an internal operation or the like is performed in the electronic device.

(3) Hinge shaft 23 according to the above exemplary embodiment is rotationally movable relative to both of first attachment plate 21 and second attachment plate 22. This allows movable cover 12 attached to second attachment plate 22 to rotationally move relative to first attachment plate 21. However, the present disclosure is not limited to this, and hinge shaft 23 may be rotationally movable relative to only one of first attachment plate 21 and second attachment plate 22. Even in this case, movable cover 12 is rotationally movable relative to first attachment plate 21.

The exemplary embodiments have been described above as examples of the technique in the present disclosure. For that purpose, the accompanying drawings and the detailed description have been provided. The constituent elements illustrated in the accompanying drawings and described in the detailed description can include not only constituent elements essential for solving the problems, but also constituent elements that are not essential for solving the problems but required to describe the above technique as an example. Therefore, it should not be immediately construed that these constituent elements that are not essential are essential just because the constituent elements are described in the accompanying drawings and the detailed description. Since the above-described exemplary embodiments are for exemplifying the technique of the present disclosure, various modifications, replacements, additions, and omissions can be made within the scope of the claims or their equivalents.

INDUSTRIAL APPLICABILITY

The present disclosure is widely applicable to an electronic device having a cover that constitutes a part of one surface of a housing in which an electronic component is contained.

REFERENCE MARKS IN THE DRAWINGS

1: tablet computer
10: housing
10A: inner chassis
10a: attachment surface
10b: screw boss
10c: guide protrusion
11: fixed cover
11t: front edge
12: movable cover
12a: screw fixing part
12t: back edge
20, 20L, 20R: hinge
21: first attachment plate
21a: body
21b: screw boss insertion hole
21c: shaft bearing
21d: guide hole
22: second attachment plate
22a: body
22b: screw insertion hole
22c: shaft bearing
23: hinge shaft
24: screw
25: screw
30: operation lever
50: battery
Xd: gap

The invention claimed is:

1. An electronic device comprising:
a housing that contains an electronic component, the housing including a fixed cover and a movable cover that constitute adjacent regions of one surface of the housing;
a hinge shaft that is disposed between a first edge of the fixed cover and a second edge of the movable cover that are adjacent to each other, and supports the movable cover;
a support plate that is connected to the movable cover through the hinge shaft, and supports the movable cover rotatably about the second edge, and an inner chassis to which the fixed cover is fixed, the inner chassis having an attachment surface that is a plane surface, wherein the support plate is movably attached to the attachment surface to enable the hinge shaft to move away from the first edge of the fixed cover, the attachment surface faces the fixed cover, and the attachment surface is inclined towards the hinge shaft, approaching the fixed cover.

2. The electronic device according to claim 1, wherein the attachment surface is configured to enable the hinge shaft to be moved toward an outside of the housing in a case where the hinge shaft is moved away from the first edge of the fixed cover.

3. The electronic device according to claim 2, wherein the support plate is attached to the attachment surface with use of a screw, the support plate has an insertion hole into which the screw is inserted, and the insertion hole extends in a direction that crosses the hinge shaft.

4. The electronic device according to claim 1, wherein the housing detachably contains a battery, and the movable cover is a cover that is opened and closed in a case where the battery is attached or detached.

* * * * *